(12) United States Patent
Goetz

(10) Patent No.: US 7,300,079 B2
(45) Date of Patent: Nov. 27, 2007

(54) ARRANGEMENT HAVING A LEAD SEAL FOR SEALING AN OPENING IN A HOUSING

(75) Inventor: Juergen Goetz, Villingen-Schwenningen (DE)

(73) Assignee: Siemens AG, München (DE)

( * ) Notice: Subject to any disclaimer, the term of this patent is extended or adjusted under 35 U.S.C. 154(b) by 0 days.

(21) Appl. No.: 11/223,152

(22) Filed: Sep. 12, 2005

(65) Prior Publication Data

US 2006/0030194 A1 Feb. 9, 2006

Related U.S. Application Data

(63) Continuation of application No. PCT/EP2005/050422, filed on Feb. 1, 2005.

(30) Foreign Application Priority Data

Feb. 9, 2004 (DE) ...................... 10 2004 006 291

(51) Int. Cl.
 *B65D 27/36* (2006.01)
(52) U.S. Cl. .................. 292/307 B; 292/320; 292/316
(58) Field of Classification Search ................ 292/328, 292/329, 307 B, 313, 316, 320
 See application file for complete search history.

(56) References Cited

U.S. PATENT DOCUMENTS 3,980,332 A * 9/1976 King, Sr. ..................... 292/320
4,552,394 A * 11/1985 Kesselman ............... 292/307 B
4,600,220 A * 7/1986 Agnelli ........................ 285/80

FOREIGN PATENT DOCUMENTS

| DE | 32 12 255 A1 | 10/1983 |
|---|---|---|
| DE | 44 31 281 A1 | 3/1996 |
| DE | 196 42 045 C2 | 4/1998 |
| EP | 0 090 921 A1 | 10/1983 |
| EP | 0 619 634 A1 | 10/1994 |
| EP | 0 977 024 * | 2/2000 |
| FR | 2 810 018 A1 | 12/2001 |

(Continued)

OTHER PUBLICATIONS

Derwent Abstract—DE 196 42 045 C2; Apr. 16, 1998; Grote & Hartmann GmbH & Co KG, D-42369 Wuppertal (Germany).

(Continued)

*Primary Examiner*—Gary Estremsky

(57) ABSTRACT

The invention relates to a lead seal which is introduced into an opening, having a projection, which shaves off when there is a continued insertion movement, the base body being provided with a hook which can be latched opposite the plane enclosed by the limiting contour of the opening to be sealed. In addition, an arrangement having a housing which can be joined together and having an opening to be sealed by the lead seal is the subject matter of the invention, the lead seal having a base body which is provided with a shaped section which limits, in an interlocking manner, the ability of the lead seal to move in the insertion direction. Such lead seals or arrangements have until now been deficient in terms of the intended evidence function. In this case, the invention provides a remedy by the lead seal being fixed to the second housing part opposite the plane enclosed by the limiting contour of the opening to be sealed. In addition, the hook may be in the form of a snap hook.

7 Claims, 5 Drawing Sheets

Schnitt B-B

FOREIGN PATENT DOCUMENTS

GB        2 352 027 A     1/2001
WO     WO 96/08128 A1    3/1996

OTHER PUBLICATIONS

Derwent Abstract—DE 32 12 255 A1; Oct. 6, 1983; Kienzle Apparate GmbH, D-7730 Villingen-Schwenningen (Germany).

Derwent Abstract—DE 44 31 281 A1; Mar. 7, 1996; ITT Automotive Europe GmbH, D-60488 Frankfurt (Germany).

Derwent Abstract—EP 0 619 634 A1; Oct. 12, 1994; ABB Patent GmbH, D-68309 Mannheim (Germany).

Derwent Abstract—FR 2 810 018 A1; Dec. 14, 2001; Dassault Automatis- MES ET Telecommu-nications Société anonyme (France).

Abstract—DE 0 090 921 A1; Oct. 12, 1983; Kienzle Apparate GmbH, D-7730 Villingen-Schwenningen (Germany).

* cited by examiner

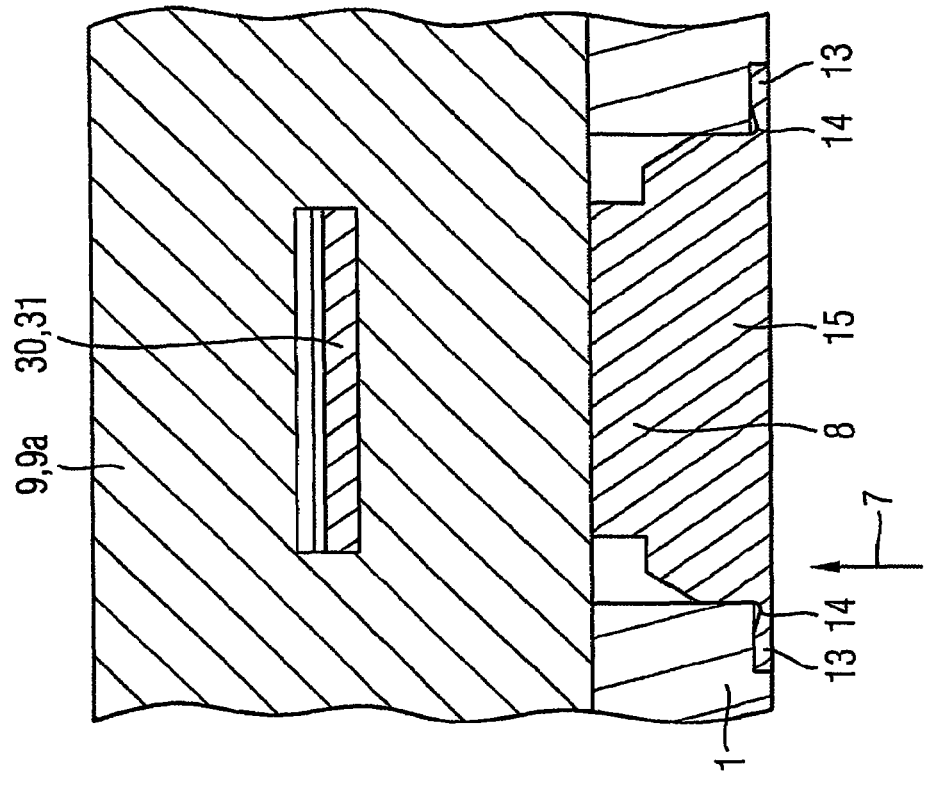
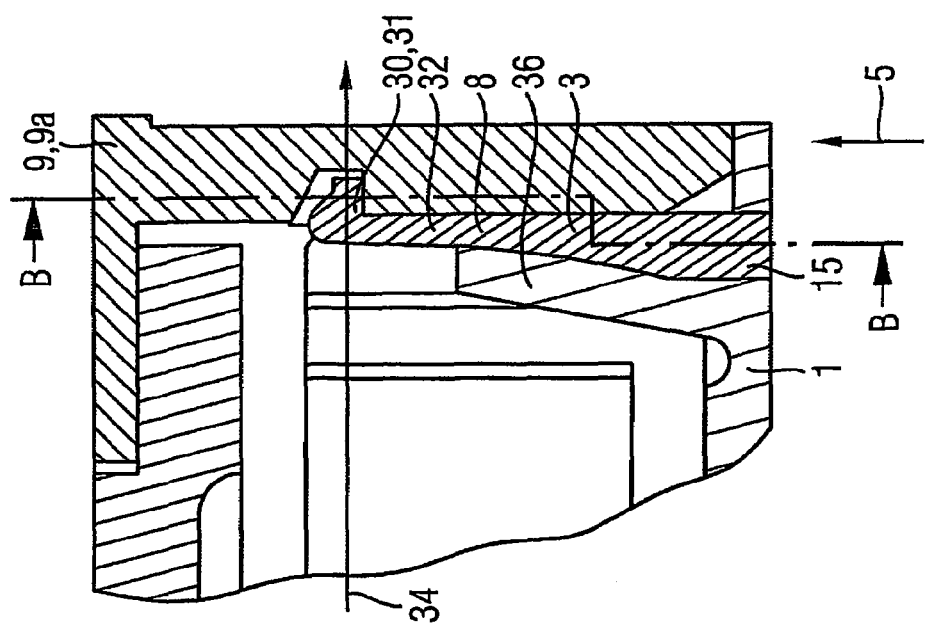

ARRANGEMENT HAVING A LEAD SEAL FOR SEALING AN OPENING IN A HOUSING

BACKGROUND OF THE INVENTION

The invention relates to a lead seal for sealing an opening, the lead seal being introduced into the opening in an insertion direction, having a base body, having a lateral projection which protrudes towards the insertion direction and is connected to the base body by means of a desired breaking point, which projection limits the insertion movement of the lead seal into the opening by means of bearing against a bearing face and shaves off after this bearing when there is a continued insertion movement, the base body being provided, on the side pointing in the insertion direction, with a hook which can be latched with a corresponding latching projection which is arranged opposite the plane enclosed by the limiting contour of the opening to be sealed. In addition, an arrangement having a housing is the subject matter of the invention, comprising a first housing part and a second housing part, which housing parts can be joined together, the first housing part having an opening, which opening is sealed, in the joined state, by means of a lead seal which is introduced into the opening in an insertion direction, the lead seal having a base body which is provided with a shaped section which limits, in an interlocking manner, the ability of the lead seal to move in the insertion direction.

SUMMARY OF THE INVENTION

One object which is often set in technology today consists in protecting components against unauthorized access. In motor vehicle tachograph technology, for example, components which are to be protected against intentional or undesired manipulation are accommodated in housings which are sealed by means of lead seals such that there is always evidence of any manipulation.

The German laid-open specification DE 32 12 255.1 A has already disclosed a lead seal and an arrangement of the type mentioned at the outset. A decisive disadvantage of the arrangement consists in the fact that the two housing components which are fixed to one another by means of a snap hook can be separated from one another, in particular under the influence of high forces, without one of the lead seals being damaged. The basic evidence function of the seal is therefore not necessarily provided.

Using the background of the problems and disadvantages of the prior art, the invention is based on the object of providing a lead seal and an arrangement having a lead seal of the type mentioned at the outset which meets the required evidence function under all conditions. In this regard, the invention proposes that the lead seal mentioned first at the outset be provided with a hook in the form of a snap hook. A decisive advantage of the invention lies in the best possible but nevertheless simple fixing of the lead seal in the intended opening such that the lead seal can no longer be removed from the opening without any damage being caused. In addition, one solution according to the invention relating to this object provides for an arrangement mentioned second at the outset in which the lead seal is fixed to the second housing part opposite the plane enclosed by the limiting contour of the opening to be sealed. If the lead seal is fixed to the second housing part, the housing can no longer be opened and the lead seal can no longer be removed from the opening to be sealed without the lead seal being damaged.

One expedient development of the lead seal according to the invention provides for a section, in the form of a leaf spring, of the lead seal to extend between the base body and the snap hook such that the hook is flexible in a snap-in direction. Providing the snap hook with flexibility by means of a leaf spring is, on the one hand, a particularly cost-effective solution but, on the other hand, results in particularly expedient kinetics alongside the required robustness, since the leaf spring proves to be flexible in one direction but rigid in the direction oriented perpendicular thereto.

The arrangement described above having a lead seal may provide an interlocking or force-fitting connection or a connection using techniques such as soldering, bonding or welding between the lead seal and the second housing part, or else a combination of these possibilities, for example an adhesive bond with a resilient force-fitting connection. However, the interlocking and force-fitting connection between the lead seal and the second housing part is particularly expedient if the base body of the lead seal is provided with a hook which can be latched with a corresponding latching projection on the second housing part which is arranged opposite the plane enclosed by the limiting contour of the opening to be sealed. In a similar manner to that for the lead seal mentioned first at the outset, when using the arrangement according to the invention, the lead seal may also have a section, in the form of a leaf spring, between the snap hook and the base body, and, in addition, it is also possible, in the same way, for the latching projection to be of resilient design. The hook is expediently arranged at that end of the base body which is at the front in the insertion direction.

One particularly expedient application of the arrangement according to the invention results if the first housing part has at least one fixing arrangement for the purpose of fixing the second housing part, and the housing has, in the region of any fixing arrangement, an opening, by means of which the snap hook can be unlatched, this opening being sealed by means of the lead seal. Particularly expedient in this case is a refinement of the invention in which there is at least one lead seal of a first type and a lead seal of a second type amongst the lead seals sealing a plurality of openings, the lead seal of the first type being secured on the first housing part against a movement counter to the insertion direction, and the lead seal of the second type being secured on the second housing part against a movement counter to the insertion direction. In this way, the lead seal of the second type will necessarily be damaged in any case when the housing parts are separated. Here too, the lead seal of the second type is expediently fixed to the second housing part by means of a snap hook. In the same way, the fixing arrangements between the two housing parts are advantageously in the form of mutually associated snap hooks and latching projections.

The ability of the lead seal to move in the insertion direction is advantageously restricted such that the shaped section is formed on the base body as a projection which protrudes laterally with respect to the insertion direction and is connected to the base body by means of a desired breaking point, which projection limits the insertion movement of the lead seal into the opening by means of bearing against a bearing face and shaves off after this bearing when there is a continued insertion movement.

In order to make it even more difficult to gain access to the housing interior without leaving any evidence of this, it is expedient if the lead seals of the first type and the lead seals of the second type, which each seal an opening in the housing, both have a visible region which can be seen by an observer from the outside in the joined state, and an invisible region which cannot be seen by the observer from the outside in the joined state, and the visible regions of the two types of lead seal are of identical design.

Since the lead seal of the second type is subject to the conflict which is typical for a sealing component, namely between the reliable evidence function, on the one hand, and the long life and the secure position at the destination site, on the other hand, it is expedient if a guide element, which supports the section, in the form of a leaf spring, of the lead seal in a reinforcing manner, is arranged to the side of the opening on the first housing part, opposite the plane enclosed by the limiting contour of the opening. It is thus possible for a material to be selected for the lead seal which has only low strength properties.

In the arrangement according to the invention, a formation of the lead seal of the first type has proven particularly expedient which, as the lateral projection shaves off, brings about unlatching of the fixing arrangement if the insertion movement is continued after bearing of the lateral projection against the bearing face.

BRIEF DESCRIPTION OF THE SEVERAL VIEWS OF THE DRAWINGS

As a result, the invention will be explained in more detail using a specific exemplary embodiment with reference to drawings, the invention not being restricted to the illustrations of this example. In the drawings.

DETAILED DESCRIPTION OF THE INVENTION

Figure 1:
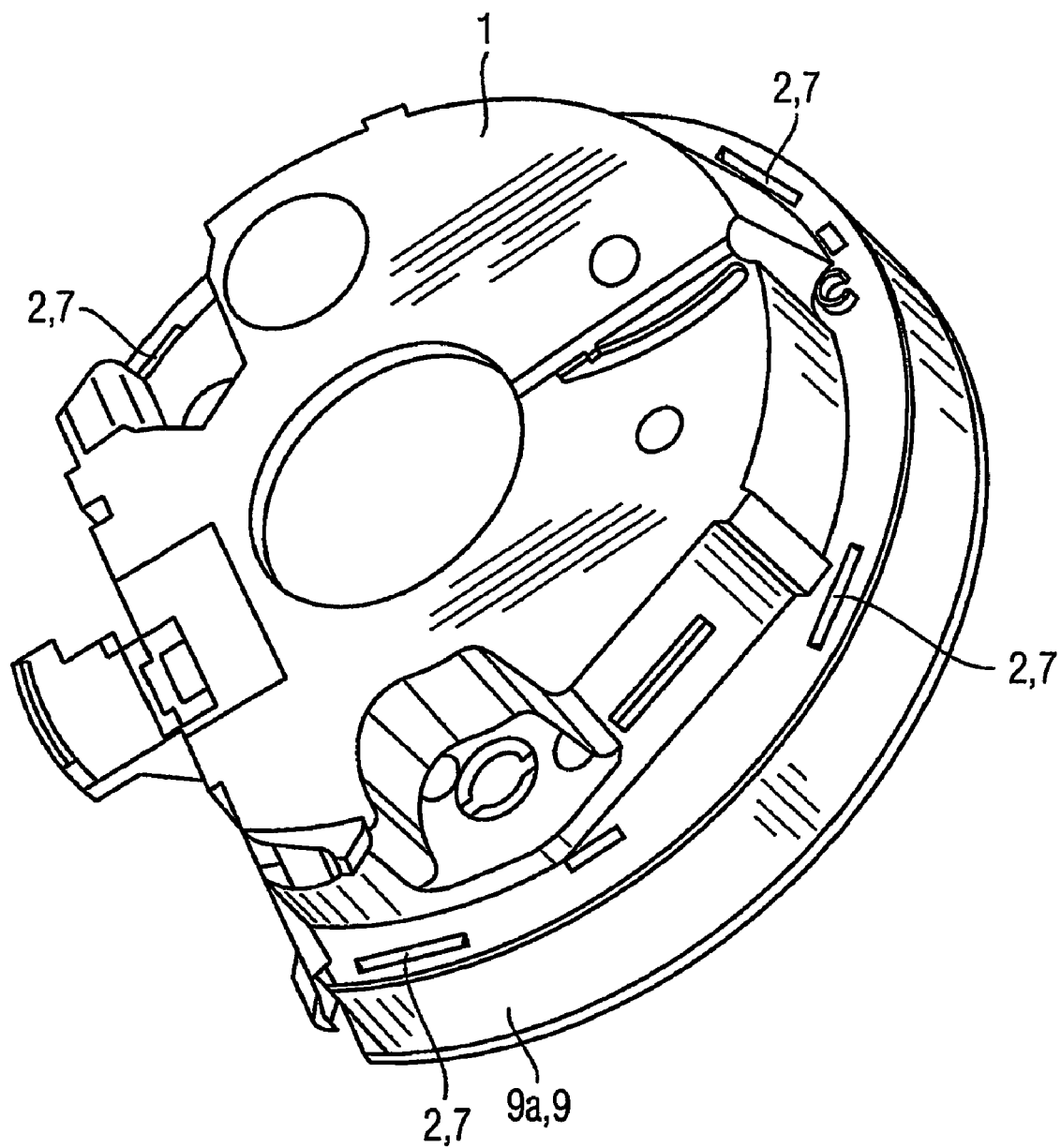
FIG. 1 shows a three-dimensional illustration, from the rear, of a first housing part and second housing part (front ring) having lead seals according to the invention.
Figure 2:
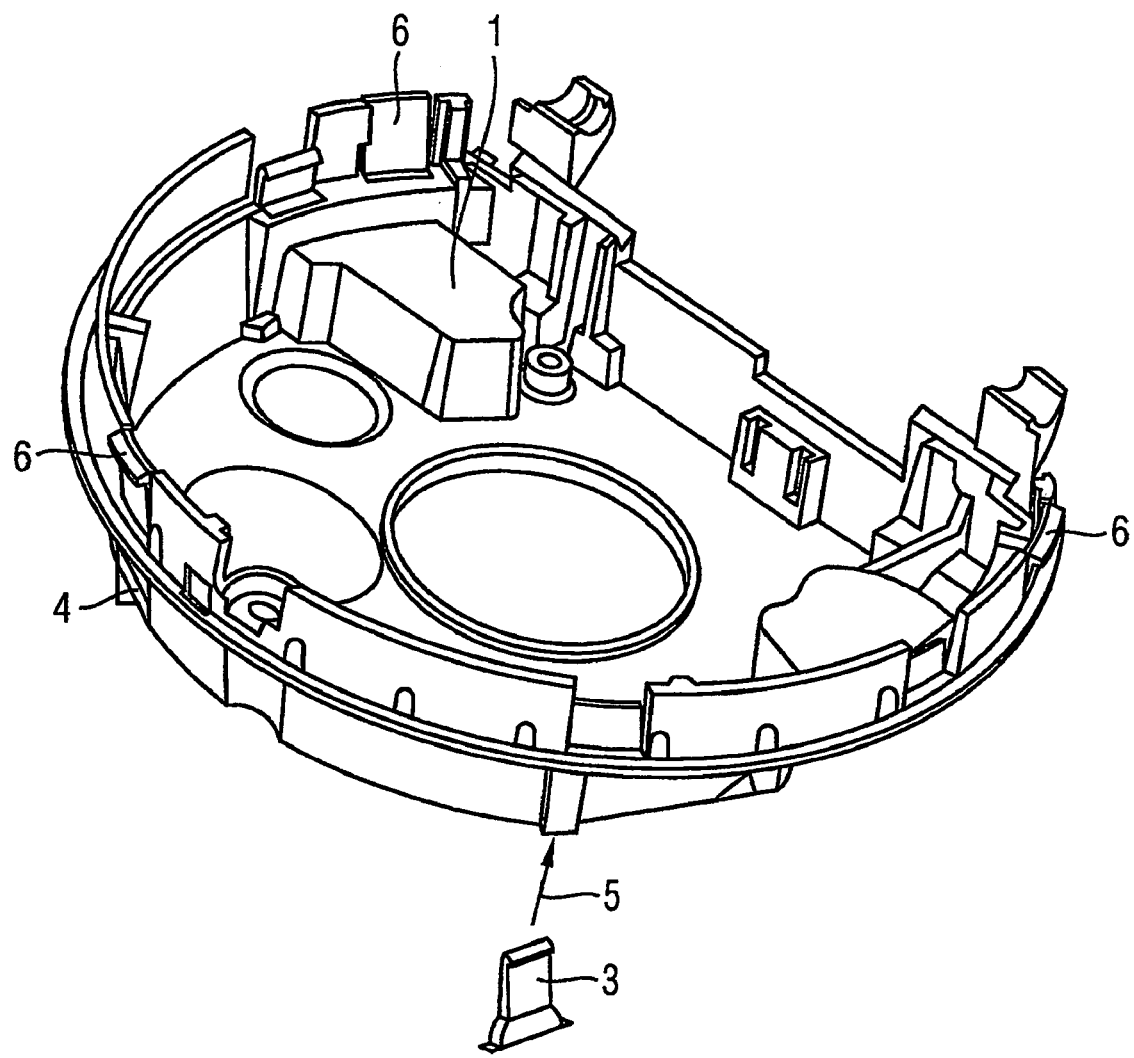
FIG. 2 shows the component illustrated in FIG. 1, from the front, without the second housing part (front ring)

FIGS. 1 and 2 show a first housing part 1 which is in the form of a rear housing cover, the illustration in FIG. 1 also comprising a front ring 9a of a second housing part 9. The perspective from the rear in FIG. 1 clearly shows elongate, slot-like openings 2 into which lead seals of the second type 3 and lead seals of the first type 4 according to the invention can be inserted in an insertion direction 5 in the arrangement according to the invention. As can be seen in FIG. 2, fixing arrangements 6 are provided on the inside over the circumference of the first housing part 1 and interact with corresponding means on a second housing part (not illustrated) so as to hold the whole housing together. The fixing arrangements 6 are in the form of resilient snap hooks. FIG. 1 shows the visible region 7 of the lead seals of the first type 4 and of the lead seals of the second type 3, which is of identical design, whereas the invisible region 8 shown in FIGS. 4, 5 and 6 in the case of the lead seals of the first type 4 is different from that for the lead seals of the second type 3.

Figure 3:
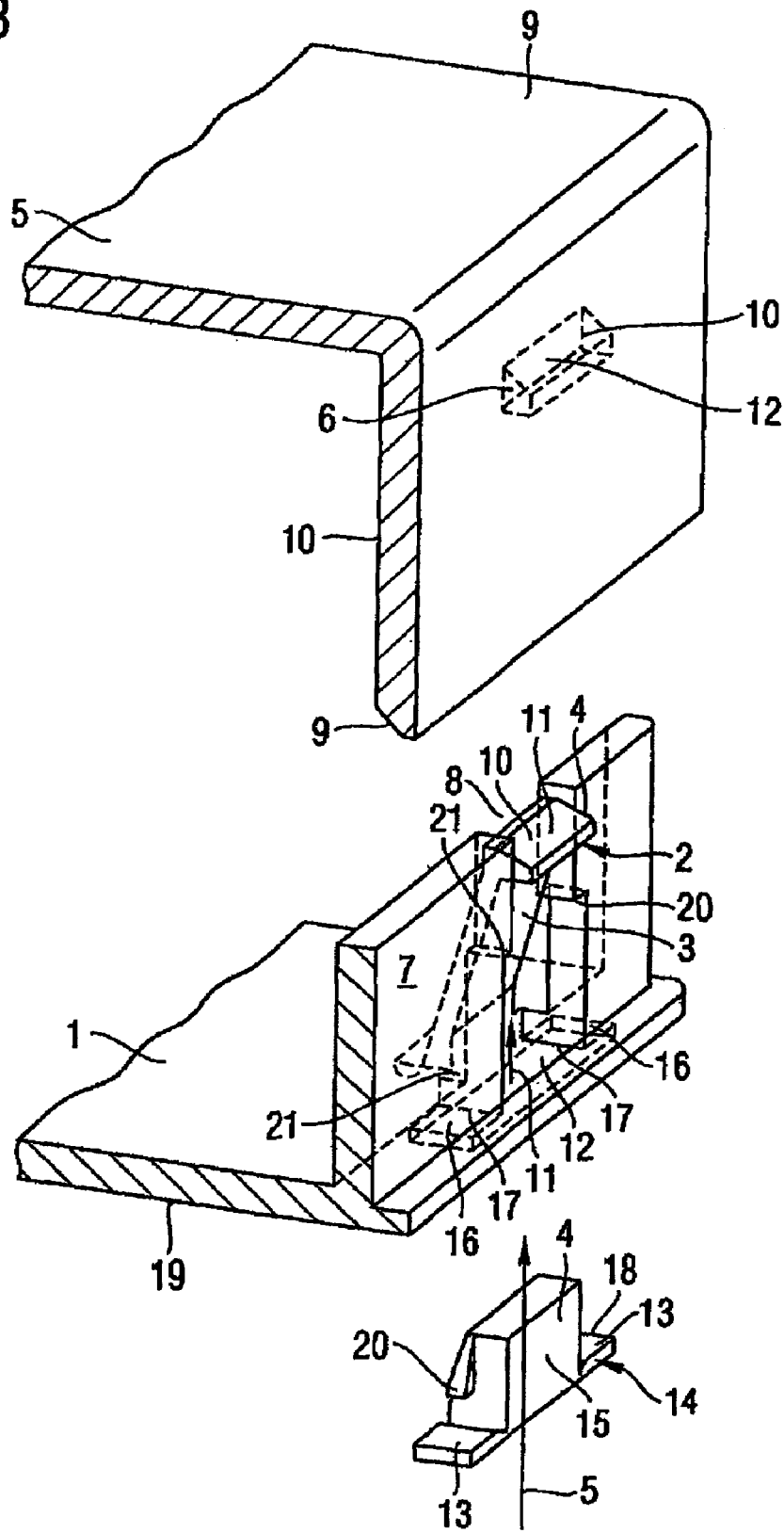
FIG. 3 shows a three-dimensional assembly of a first housing part, a second housing part and a lead seal of the first type.
Figure 4:
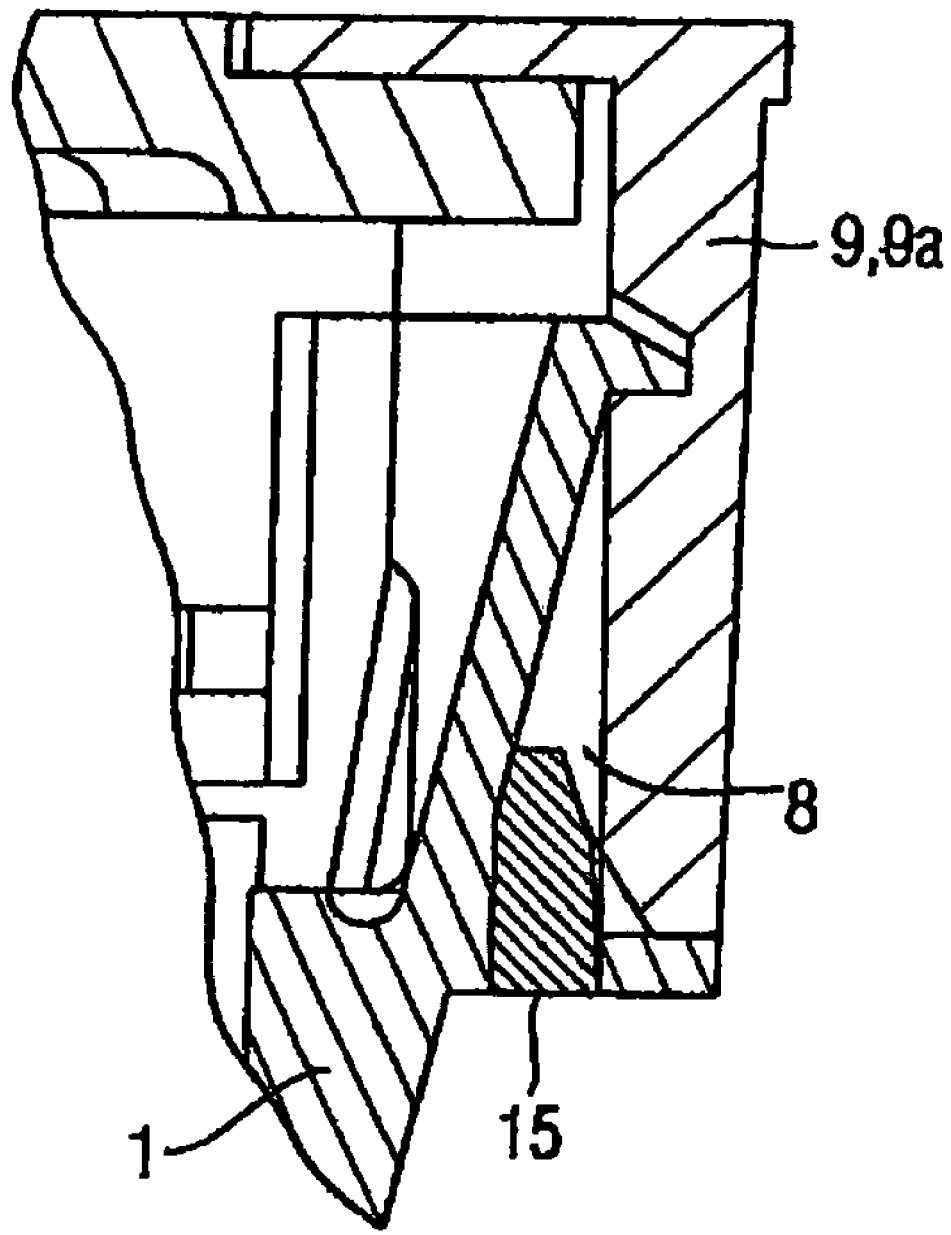
FIG. 4 shows a sectional illustration of the assembly in FIG. 3, and FIGS. 5 and 6 each show a sectional illustration of an assembly of a first housing part, a second housing part and a lead seal of the second type in accordance with the invention.

FIGS. 3 and 4 show the arrangement of a lead seal of the first type 4 on a first housing part 1 and a second housing part 9, in detail. The two housing parts 1, 9 are held together by means of a fixing arrangement 6 in the form of a latching connection 10, the fixing arrangement 6 being in the form of a resilient latching hook 11 on the first housing part, said latching hook 11 interacting in a retaining manner with a corresponding recess 12 in a second housing part 9. An opening 2 is provided to the side of the latching hook 11 and can be sealed by means of a lead seal of the first type 4. The lead seal of the first type 4 is provided with two projections 13 which protrude laterally and substantially perpendicularly with respect to the insertion direction 5 and are connected to a base body 15 of the lead seal by means of a desired breaking point 14. In the final assembly position, the laterally protruding projections 13 come to bear against in each case one bearing face 16 on the first housing part 1. If the lead seal of the first type 4 is pushed further in in the insertion direction 5, the projections 13 shave off in the region of the desired breaking points 14 by means of edges 17 provided on the bearing faces 16. The base body 15 of the lead seal of the first type 4 is provided with two lateral barbs 20 which latch into corresponding cutouts 21 in the first housing part 1 in the final sealing position. If the lead seal of the first type 4 is moved further out of the final sealing position in the insertion direction 5, this causes the latching hook 11 to be knocked out of the recess 12, which simplifies disassembly of the two housing parts and at the same time provides the evidence function of the opening by means of the lead seal 4. If the latching hook 11 is successfully moved out of its retaining position without the lead seal of the first type 4 being removed, it is also possible to gain access to the housing interior without the lead seal 4 being damaged.

FIGS. 5 and 6 show the functioning and design of a lead seal of the second type 3 according to the invention. The lead seal of the second type 3 according to the invention has, as does the lead seal of the first type 4, a base body 15 and two lateral projections 13 which are attached to the base body by means of a desired breaking point 14. At that end of the base body 15 which guides in the snap-in direction 5, the lead seal of the second type 3 has a snap hook 30 which has, at one end, a hook 31 which can be latched with a latching projection on the second housing part 9. The snap hook is fixed to the base body 15 by means of a leaf spring section 32 such that the hook 31 is flexible in a snap-in direction 34. The first housing part 1 is provided with a resilient guide 36 supporting the leaf spring section 33 of the lead seal of the second type 3 such that the hook 31 is securely anchored on the latching projection 32. The fact that the lead seal of the second type 3 is fixed to the second housing part 9 means that the lead seal of the second type 3 cannot be moved in relation to the second housing part 9 counter to the insertion direction 5 without it being damaged. In this manner, any separation of the two housing parts 1, 9 results in destruction of the lead seal of the second type 3.

The invention claimed is:

1. A seal for sealing an opening by being introduced into the opening in an insertion direction, the seal comprising:
   an elongate base body extending along a longitudinal axis and having a rectangular cross section, wherein the base body comprises a leading end and a trailing end spaced apart from the leading end with respect to the longitudinal axis;
   a first lateral projection and a second lateral projection at the trailing end on opposite sides of the base body, wherein the first lateral projection and the second lateral projection protrude in a direction perpendicular to the longitudinal axis, wherein each one of the first lateral projection and the second lateral projection connects to the base body by means of a desired breaking point, wherein each one of the first lateral projection and the second lateral projection is configured to bear against a bearing surface to limit insertion movement of the seal into the opening and to shave off at the bearing surface when there is a continued insertion movement;

a snap hook coupled to the leading end of the base body and configured to be latched with a corresponding latching projection; and a section extending between the base body and the snap hook, the section comprising a leaf spring and the hook arranged so as to be flexible in a snap-in direction.

2. A housing arrangement, comprising:

a first housing part having an opening;

a second housing part configured to be joined with the first housing part; and a seal configured to be introduced into the opening in an insertion direction to join the first housing part and the second housing pail; the seal comprising:

an elongate base body extending along a longitudinal axis and having a rectangular cross section, wherein the base body comprises a leading end and a trailing end spaced apart from the leading end with respect to the longitudinal axis;

a first lateral projection and a second lateral projection at the trailing end on opposite sides of the base body, wherein the first lateral projection and the second lateral projection protrude in a direction perpendicular to the longitudinal axis, wherein each one of the first lateral projection and the second lateral projection connects to the base body by means of a desired breaking point, wherein each one of the first lateral projection and the second lateral projection is configured to bear against a bearing surface to limit insertion movement of the seal into the opening and to shave off at the bearing surface when there is a continued insertion movement;

a snap hook coupled to the leading end of the base body and configured to be latched with a corresponding latching projection; and a section configured as a leaf spring extending between the leading end of the base body and the snap hook such that the hook is flexible in a snap-in direction.

3. The arrangement according to claim 2, wherein the first housing part includes a plurality of openings, and wherein at least one first seal and a second seal seal the openings, the first seal being secured on the first housing part against a movement counter to the insertion direction, and the second seal being secured on the second housing part against a movement counter to the insertion direction.

4. The arrangement according to claim 3, wherein the second seal is secured against a movement counter to the insertion direction by means of a snap hook and configured to be latched with the latching projection on the second housing part.

5. The arrangement according to claim 4, wherein the base body of the second seal comprises the snap hook at an end pointing in the insertion direction.

6. The arrangement according to claim 5, wherein, in the case of the second seal, a section configured as a leaf spring extends between the base body and the snap hook such that the hook is flexible in a direction perpendicular to the insertion direction.

7. The arrangement according to claim 6, further comprising a guide element arranged to support the section in a reinforcing manner, the guide element being arranged to a side of the opening on the first housing part.

* * * * *